United States Patent
Watanabe

(10) Patent No.: US 9,602,124 B2
(45) Date of Patent: Mar. 21, 2017

(54) A/D CONVERSION DEVICE HAVING LEVEL SHIFTER CIRCUIT

(71) Applicant: LAPIS Semiconductor Co., Ltd., Yokohama (JP)

(72) Inventor: Yukinobu Watanabe, Yokohama (JP)

(73) Assignee: LAPIS SEMICONDUCTOR CO., LTD., Yokohama (JP)

(*) Notice: Subject to any disclaimer, the term of this patent is extended or adjusted under 35 U.S.C. 154(b) by 0 days.

(21) Appl. No.: 15/048,992

(22) Filed: Feb. 19, 2016

(65) Prior Publication Data

US 2016/0248436 A1    Aug. 25, 2016

(30) Foreign Application Priority Data

Feb. 20, 2015 (JP) ................................ 2015-031916

(51) Int. Cl.
  *H03M 1/12* (2006.01)
(52) U.S. Cl.
  CPC ................................ *H03M 1/1295* (2013.01)
(58) Field of Classification Search
  CPC ..................................................... H03M 1/12
  USPC ..................................... 341/155; 326/38, 62
  See application file for complete search history.

(56) References Cited

U.S. PATENT DOCUMENTS

| | | | | |
|---|---|---|---|---|
| 6,181,198 B1* | 1/2001 | Poletto | ................. | G06K 7/0008 329/358 |
| 6,992,954 B2* | 1/2006 | Tsai | ..................... | G11B 7/0903 369/44.32 |
| 7,209,069 B2* | 4/2007 | Felder | ................... | H03M 1/462 341/144 |
| 7,663,520 B2* | 2/2010 | Sugihara | ................... | H02P 6/18 341/112 |
| 8,018,251 B1* | 9/2011 | Boyd | ................. | H03K 19/0175 326/62 |
| 8,022,853 B2* | 9/2011 | Guido | ................. | H03M 1/1225 341/141 |

FOREIGN PATENT DOCUMENTS

JP    H09-83365 A    3/1997

* cited by examiner

*Primary Examiner* — Peguy Jean Pierre
(74) *Attorney, Agent, or Firm* — Rabin & Berdo, P.C.

(57) ABSTRACT

An A/D conversion device includes: a level shifter circuit configured to level-shift an analog voltage of an input voltage signal to generate a conversion signal; an A/D converter configured to A/D-convert a voltage of the conversion signal supplied from the level shifter circuit. The level shifter circuit subtracts an instantaneous voltage value of the input voltage signal from a reference voltage so as to output a signal value as the conversion signal.

12 Claims, 11 Drawing Sheets

US 9,602,124 B2

A/D CONVERSION DEVICE HAVING LEVEL SHIFTER CIRCUIT

BACKGROUND OF THE INVENTION

1. Field of the Invention

The present invention relates to an A/D conversion device including an A/D converter.

2. Description of the Related Art

An input range of the A/D converter, i.e., a voltage allowable range of the input voltage be supplied to the A/D converter is determined with the specification of the A/D converter. Therefore, when the input signal (i.e., the input voltage signal) having a voltage range greater than the input range is subjected to the A/D conversion, it is required to lower the voltage value of the input signal into the input range of the A/D converter.

Thus, there has been suggested an A/D conversion device comprising a resistance voltage-dividing circuit provided at the front of the A/D converter so as to voltage-divide the voltage value of the input signal with two resistors to lower its voltage value (e.g., Japanese Patent Application Kokai No. H09-83365), in order to compress a voltage range in which a voltage value of the input signal varies within the input range of the A/D converter.

SUMMARY OF THE INVENTION

When, on the other hand, the voltage value of the input signal is lowered by the resistance voltage-dividing, a problem in deterioration of A/D conversion accuracy occurs, because the dynamic range of the input signal is condensed.

Thus, it is an object of the present invention to provide an A/D conversion device capable of converting into a digital value from the input signal having the voltage range larger than the input range of the A/D converter without the deterioration of A/D conversion accuracy.

An A/D conversion device according to the present invention comprises:

a level shifter circuit configured to level-shift an analog voltage of an input voltage signal to generate a conversion signal; and an A/D converter configured to A/D-convert a voltage of said conversion signal supplied from said level shifter circuit into a digital value, wherein said level shifter circuit subtracts an instantaneous voltage value of said input voltage signal from a reference voltage so as to output a signal value as said conversion signal.

In addition, another A/D conversion device according to the present invention comprises:

an input signal selector configured to sequentially alternatively select the first to the n-th input voltage signals ("n" is an integer of 2 or more), and output the selected input voltage signal via an output line;

a subtraction circuit configured to subtract, from a reference voltage, the voltage value of said input voltage signal output from said selector so as to generate a conversion signal having a reduced voltage value; and an A/D converter configured to A/D-convert a voltage value of said conversion signal into a digital value.

According to the present invention, when the input voltage signal is subjected to A/D conversion with the A/D converter, the level shifter circuit provided to the front of the A/D converter subtracts the input voltage signal from the reference voltage so as to generate the conversion signal having the subtracted voltage value of the input signal to supply the conversion signal to the A/D converter. By this, even if a voltage range in which a voltage value of the input signal varies is greater than the input range of the A/D converter, the level shifter circuit enables to keep its voltage value within the input range of the A/D converter without compressing the voltage value of the input signal.

Therefore, according to the present invention, it is possible to convert, into a digital value, from the input signal having the voltage range greater than the input range of the A/D converter without the deterioration of A/D conversion accuracy.

BRIEF DESCRIPTION OF THE DRAWINGS

Some aspects and other features of the present invention are explained in the following description, taken in connection with the accompanying drawing figures wherein.

DETAILED DESCRIPTION OF THE INVENTION

Embodiments of the present invention will be described below in detail with reference to the drawings.

Figure 1:
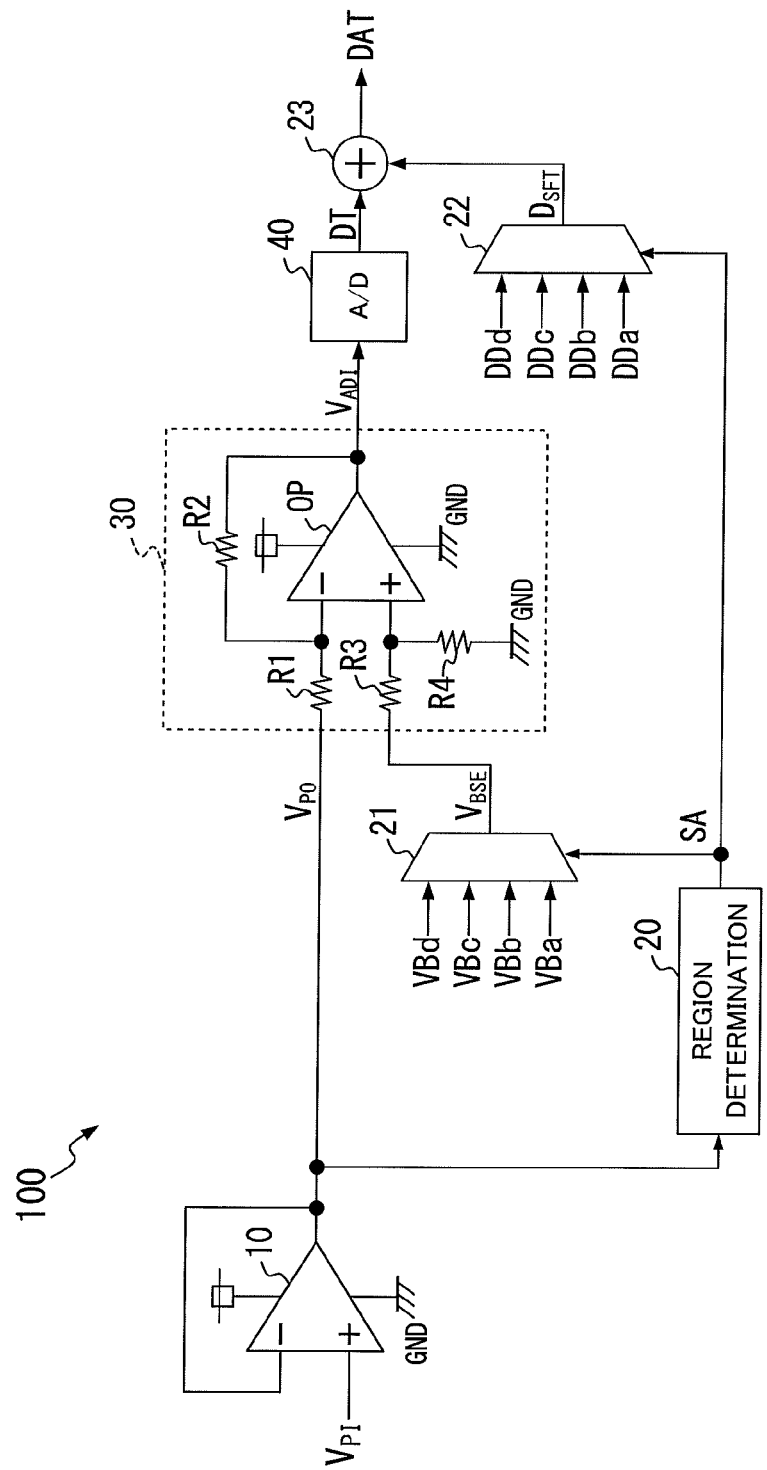
FIG. 1 is a circuit diagram illustrating a configuration of an A/D conversion device 100 according to the present invention.

FIG. 1 is a circuit diagram illustrating an example of an A/D conversion device 100 according to the present invention. The A/D conversion device 100 formed on a semiconductor chip includes, as shown in FIG. 1, an operational amplifier 10, a region determination part 20, selectors 21 and 22, an adder 23, a subtraction circuit 30 (i.e., level shifter circuit) and an A/D converter 40. In addition, the region determination part 20 and the selector 21 constitute a reference voltage setting part.

The operational amplifier 10 is a so-called voltage-follower circuit in which its own output terminal and inversion input terminal are connected to each other. The operational amplifier 10 amplifies an input signal $V_{PI}$ supplied via its non-inversion input terminal with a gain "1" to generate an input signal $V_{PO}$ and supplies the same to the region determination part 20 and the subtraction circuit 30 simultaneously. Further, a voltage range within which each voltage value of the input signals $V_{PI}$ and $V_{PO}$ can be changed (simply referred to as the input voltage range hereinafter) has a width from 0 volts to the voltage value VBd (e.g., 20 volts) in the example as shown in FIG. 2.

The region determination part 20 determines which of the plural voltage regions an instantaneous voltage value of the input signal $V_{PO}$ belongs to, wherein the plural voltage regions have been divided from the input voltage range. The input voltage range is divided so that each of the voltage regions has a width which is equal to or less than the input range of the A/D converter 40. Further, in order to improve the A/D conversion accuracy toward the maximum, each width of the plural voltage regions is preferably set to the same as the input range of the A/D converter 40.

Figure 2:
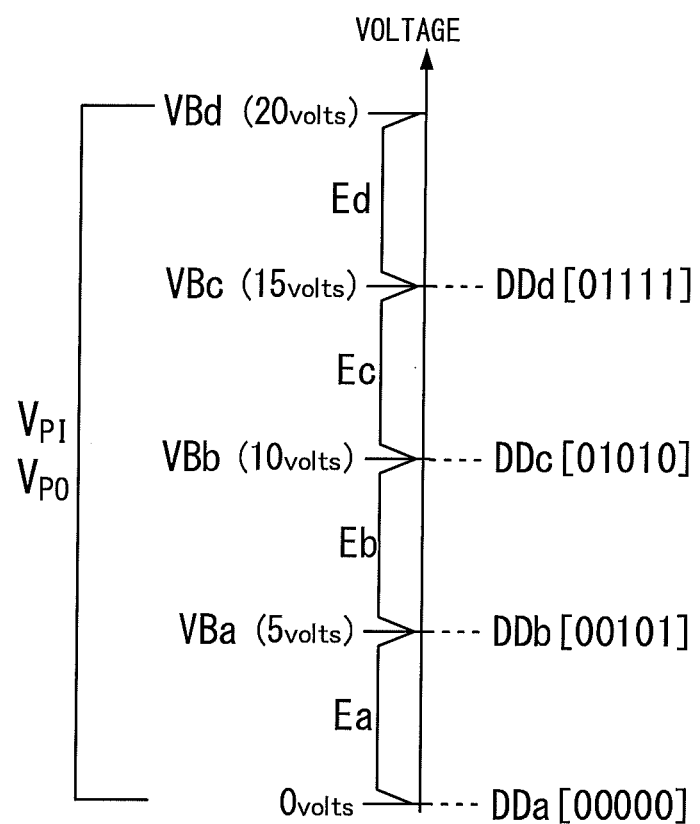
FIG. 2 is a diagram illustrating a voltage range in which a voltage value of each of input signals $V_{PI}$ and $V_{PO}$ varies and voltage regions Ea, Eb, Ec and Ed therein.

For example, as shown in FIG. 2, in case that the maximal voltage value VBd of the input voltage range is 20 volts and the maximal voltage value VBa in the input range of the A/D converter 40 is 5 volts, the input voltage range is divided into four of voltage regions Ea, Eb, Ec and Ed per 5 volts. Therefore, under this circumstance, the region determination part 20 determines which of the plural voltage regions Ea, Eb, Ec and Ed the instantaneous voltage value of the input signal $V_{PO}$ belongs to. That is, the region determination part 20 selects, from the plural voltage regions, an instantaneous voltage region including the instantaneous voltage value of the input voltage signal. Further, the maximal voltage value in the voltage region Ea is the voltage value VBa (e.g., 5 volts) shown in FIG. 2. The maximal voltage value in the voltage region Eb is the voltage value VBb (e.g., 10 volts) shown in FIG. 2. In addition, the maximal voltage value in the voltage region Ec is the voltage value VBc (e.g., 15 volts) shown in FIG. 2. The maximal voltage value in the voltage region Ed is the voltage value VBd (e.g., 20 volts) shown in FIG. 2.

The region determination part 20 supplies a region determination signal SA denoting the determined voltage region to the selectors 21 and 22.

A s shown in FIG. 2, the selector 21 in the reference voltage setting part (i.e., reference voltage selector) selects a voltage value VB corresponding to the determined voltage region denoted by the region determination signal SA from the maximal voltage values VBa, VBb, VBc and VBd of the respective voltage regions of the voltage regions Ea to Ed, and then the selector 21 supplies the selected maximal voltage value as a reference voltage $V_{BSE}$ to the subtraction circuit 30.

In other words, when the region determination signal SA denoting the voltage region Ea shown in FIG. 2 is supplied, the selector 21 selects the voltage value VBa (5 volts) to supply the reference voltage $V_{BSE}$ having the voltage value VBa to the subtraction circuit 30. In addition, when the region determination signal SA denoting the voltage region Eb shown in FIG. 2 is supplied, the selector 21 selects the voltage value VBb (10 volts) to supply the reference voltage $V_{BSE}$ having the voltage value VBb to the subtraction circuit 30. In addition, when the region determination signal SA denoting the voltage region Ec shown in FIG. 2 is supplied, the selector 21 selects the voltage value VBc (15 volts) to supply the reference voltage $V_{BSE}$ having the voltage value VBc to the subtraction circuit 30. In addition, when the region determination signal SA denoting the voltage region Ed shown in FIG. 2 is supplied, the selector 21 selects the voltage value VBd (20 volts) to supply the reference voltage $V_{BSE}$ having the voltage value VBd to the subtraction circuit 30.

The selector 22 (i.e., shift data selector) selects a datum DD (corresponding to a voltage region denoted by the region determination signal SA) from data DDa, DDb, DDc, and DDd of N bits ("N" is an integer of 2 or more) those denote the minimal voltage values of the voltage regions Ea to Ed respectively, and then the selected datum as a shift datum $D_{SFT}$ to the adder 23. Further, for example, as shown in FIG. 2, when the voltage value of 1 volt is denoted with a 1 bit precision, the shift data DDa, DDb, DDc and DDd each being 5 bits are shown as follows:

DDa: (00000),
DDb: (00101),
DDc: (01010), and
DDd: (01111).

As shown in FIG. 1, the subtraction circuit 30 has the resistors R1 to R4 and the operational amplifier OP. The inversion input terminal of the operational amplifier OP is connected to one end of the resistor R1. The foregoing input signal $V_{PO}$ is applied to the other end of the resistor R1. Furthermore the inversion input terminal of the operational amplifier OP is connected to one end of the resistor R2. The other end of the resistor R2 is connected to the output terminal of the operational amplifier OP. The non-inversion input terminal of the operational amplifier OP is connected to one end of the resistor R3. The reference voltage $V_{BSE}$ is applied to the other end of the resistor R3. Furthermore the non-inversion input terminal of the operational amplifier OP is connected to one end of the resistor R4. The ground potential GND is applied to the other end of the resistor R4. Further, every resistance value of the resistors R1 to R4 is the same.

In the above configuration, the subtraction circuit 30 subtracts the input signal $V_{PO}$ from the reference voltage $V_{BSE}$ so as to level-shift an instantaneous voltage value of the input signal $V_{PO}$ into a reduced voltage value thereof to generate a level shift input signal $V_{ADI}$ (i.e., the conversion signal). The subtraction circuit 30 thus supplies the level shift input signal $V_{ADI}$ to the A/D converter 40.

The A/D converter 40 performs an A/D-conversion of a voltage value of the level shift input signal $V_{ADI}$ into a digital value to generate a digital datum DT of N bits and supply the same to the adder 23.

The adder 23 adds the digital datum DT to the foregoing shift datum $D_{SFT}$ to generate a digital datum DAT of N bits obtained. In other words, in order to compensate for (or counterbalance) the extent of reduction of the voltage value level-shifted by the subtraction circuit 30, the adder 23 adds, to the digital datum DT, the shift datum $D_{SFT}$ denoting the digital value corresponding to the level-shifted extent.

The operation of the A/D conversion device 100 having a configuration shown in FIG. 1 will be described below with reference to FIG. 2 to FIG. 6.

Figure 3:
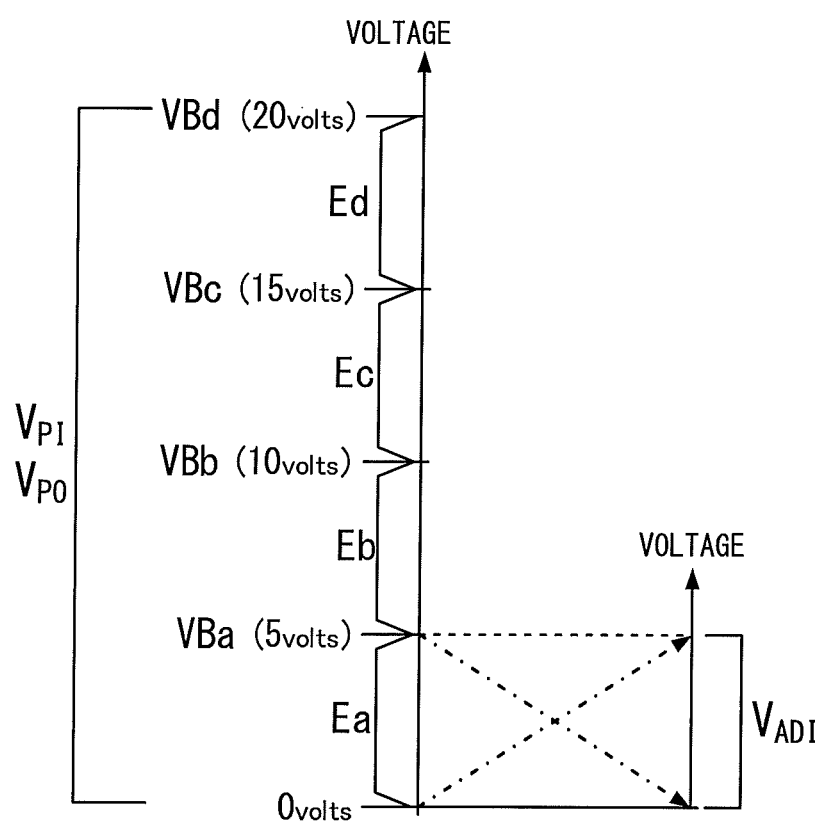
FIG. 3 is a diagram illustrating a mode for level-shifting of a voltage value preformed in a subtraction circuit 30 when a voltage value in the input signal $V_{PO}$ is in a range of the voltage region Ea.

First of all, in case that a voltage value of the input signal $V_{PO}$ is in the range of voltage region Ea (0 volts to 5 volts) shown in FIG. 2, the selector 21 supplies the reference voltage $V_{BSE}$ having the voltage value VBa (5 volts) to the subtraction circuit 30. Furthermore, the selector 22 supplies the shift datum DDa (00000) to the adder 23. Under this circumstance, the subtraction circuit 30 supplies, to the A/D converter 40, a level shift input signal $V_{ADI}$ having a voltage value which is obtained by subtracting the input signal $V_{PO}$ from the reference voltage $V_{BSE}$ having the voltage value VBa (5 volts). Further, the voltage value of the input signal $V_{PO}$ is in the range of voltage region Ea. Therefore, when the input signal $V_{PO}$ is subtracted from the voltage value VBa (5 volts), as shown in FIG. 3, the input signal $V_{PO}$ having the voltage value of voltage region Ea (0 volts to 5 volts) is converted into the level shift input signal $V_{ADI}$ which is level-shifted in the voltage range of voltage value VBa (5 volts) to 0 volts. Here, the level-shifted amount of the voltage value is zero. In other words, when the voltage value of the input signal $V_{PO}$ is in the voltage range of voltage value VBa (5 volts) to 0 volts being the input range of the A/D converter 40, the level-shifted amount of the voltage value in the subtraction circuit 30 is zero. The A/D converter 40 supplies, to the adder 23, the digital datum DT of N bits, e.g., 5 bit which is a digital value obtained by converting the level shift input signal $V_{ADI}$ having the voltage range of voltage value VBa (5 volts) to 0 volts. Under this circumstance, the adder 23 outputs, as a final digital datum DAT, a result of addition obtained by adding the shift datum DDa (00000) to the digital datum DT. In other words, since the level-shifted amount of the voltage value is zero in the subtraction circuit 30, the extent to be compensated at this stage of digital datum is zero. Thus, under this circumstance, the adder 23 adds the shift datum DDa (00000) denoting "0" of the extent of level shift to the digital datum DT.

Figure 4:
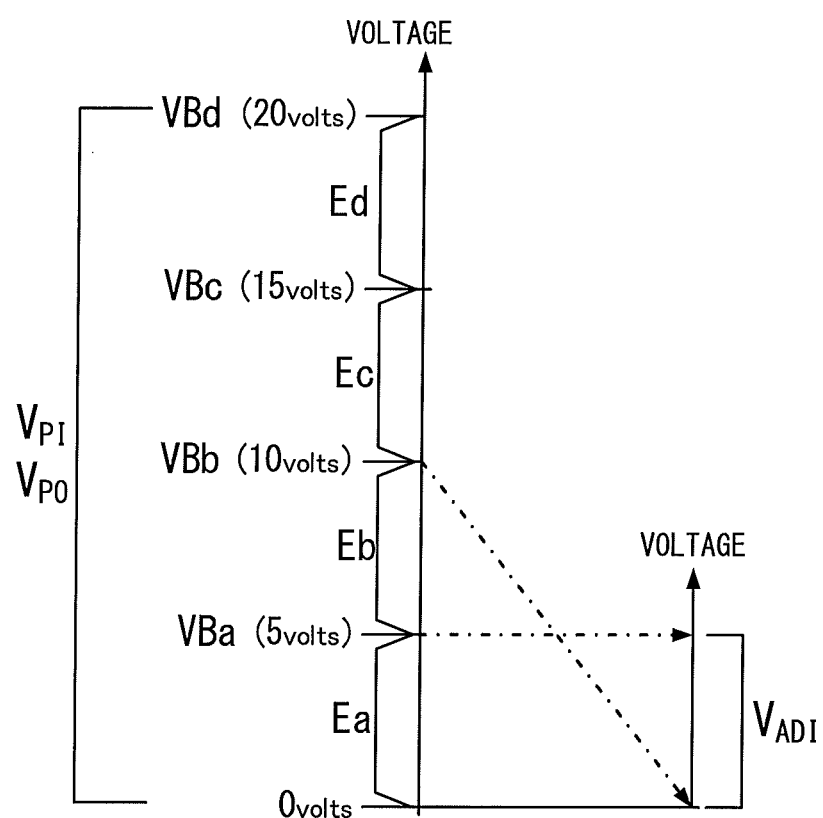
FIG. 4 is a diagram illustrating a mode for level-shifting of a voltage value preformed in the subtraction circuit 30 when a voltage value in the input signal $V_{PC}$ is in a range of the voltage region Eb.

In addition, in case that a voltage value of the input signal $V_{PO}$ is in the range of voltage region Eb (5 volts to 10 volts) shown in FIG. 2, the selector 21 supplies the reference voltage $V_{BSE}$ having the voltage value VBb (10 volts) to the subtraction circuit 30. Furthermore, the selector 22 supplies the shift datum DDb (00101) to the adder 23. Under this circumstance, the subtraction circuit 30 supplies, to the A/D converter 40, a level shift input signal $V_{ADI}$ having a voltage value which is obtained by subtracting the input signal $V_{PO}$ from the reference voltage $V_{BSE}$ having the voltage value VBb (10 volts). Further, the voltage value of the input signal $V_{PO}$ is in the range of voltage region Eb. Therefore, when the input signal $V_{PO}$ is subtracted from the voltage value VBb (10 volts), as shown in FIG. 4, the input signal $V_{PO}$ having the voltage value of voltage region Eb (5 volts to 10 volts) is converted into the level shift input signal $V_{ADI}$ which is level-shifted in the voltage range of voltage value VBa (5 volts) to 0 volts. In other words, under this circumstance, as shown in FIG. 4, the subtraction circuit 30 level-shifts the voltage value of voltage region Eb (5 volts to 10 volts) in the input signal $V_{PO}$ into the voltage range of voltage value VBa (5 volts) to 0 volts which is the input range of the A/D converter 40. Here, the level-shifted amount of the voltage value is the voltage value VBa. The A/D converter 40 supplies, to the adder 23, the digital datum DT of N bits, e.g., 5 bit which is a digital value obtained by converting the level shift input signal $V_{ADI}$ having the voltage range of voltage value VBa (5 volts) to 0 volts. Under this circumstance, the adder 23 outputs, as a final digital datum DAT, a result of addition obtained by adding the shift datum DDb (00101) to the digital datum DT. In other words, since the level-shifted amount of the voltage value is VBa (5 volts) in the subtraction circuit 30, the adder 23 adds, to the digital datum DT, the shift datum DDb (00101) denoting the voltage value VBa (5 volts) as a digital value in order to compensate for the level-shifted amount at this stage of digital datum.

Figure 5:
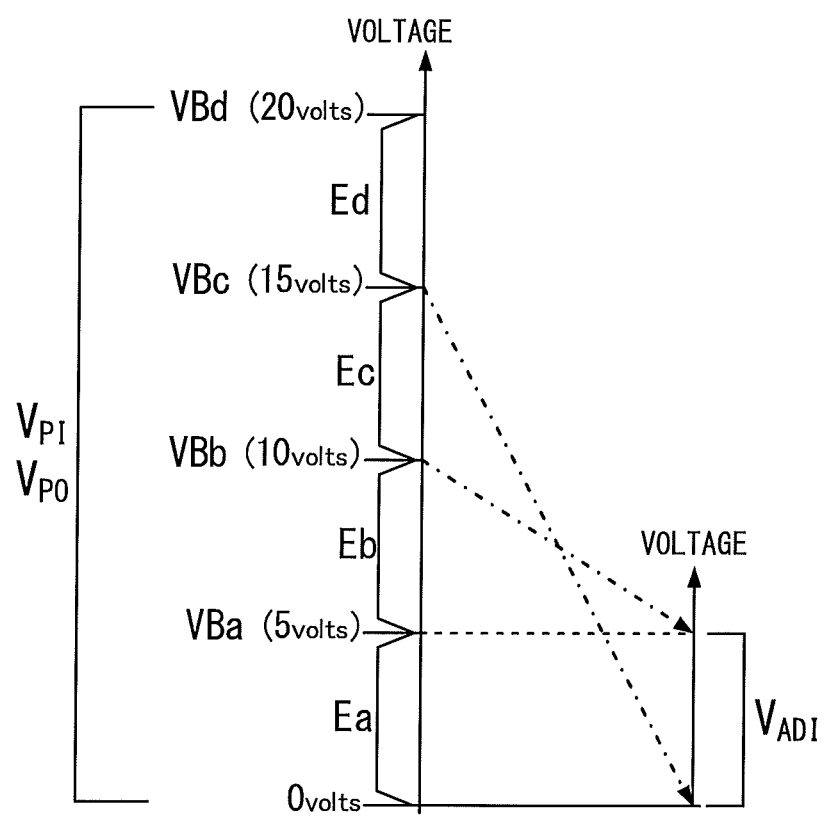
FIG. 5 is a diagram illustrating a mode for level-shifting of a voltage value preformed in the subtraction circuit 30 when a voltage value in the input signal $V_{PC}$ is in a range of the voltage region Ec.

In addition, in case that a voltage value of the input signal $V_{PO}$ is in the range of voltage region Ec (10 volts to 15 volts) shown in FIG. 2, the selector 21 supplies the reference voltage $V_{BSE}$ having the voltage value VBc (15 volts) to the subtraction circuit 30. Furthermore, the selector 22 supplies the shift datum DDc (01010) to the adder 23. Under this circumstance, the subtraction circuit 30 supplies, to the A/D converter 40, a level shift input signal $V_{ADI}$ having a voltage value which is obtained by subtracting the input signal $V_{PO}$ from the reference voltage $V_{BSE}$ having the voltage value VBc (15 volts). Further, the voltage value of the input signal $V_{PO}$ is in the range of voltage region Ec. Therefore, when the input signal $V_{PO}$ is subtracted from the voltage value VBc (15 volts), as shown in FIG. 5, the input signal $V_{PO}$ having the voltage value of voltage region Ec (10 volts to 15 volts) is converted into the level shift input signal $V_{ADI}$ which is level-shifted in the voltage range of voltage value VBa (5 volts) to 0 volts. In other words, under this circumstance, as shown in FIG. 5, the subtraction circuit 30 level-shifts the voltage value of voltage region Ec (10 volts to 15 volts) in the input signal $V_{PO}$ into the voltage range of voltage value VBa (5 volts) to 0 volts which is the input range of the A/D converter 40. Here, the level-shifted amount of the voltage value is the voltage value VBb. The A/D converter 40 supplies, to the adder 23, the digital datum DT of N bits, e.g., 5 bit which is a digital value obtained by converting the level shift input signal $V_{ADI}$ having the voltage range of voltage value VBa (5 volts) to 0 volts. Under this circumstance, the adder 23 outputs, as a final digital datum DAT, a result of addition obtained by adding the shift datum DDc (01010) to the digital datum DT. In other words, since the level-shifted amount of the voltage value is VBb (10 volts) in the subtraction circuit 30, the adder 23 adds, to the digital datum DT, the shift datum DDc (01010) denoting the voltage value VBb (10 volts) as a digital value in order to compensate for the level-shifted amount at this stage of digital datum.

Figure 6:
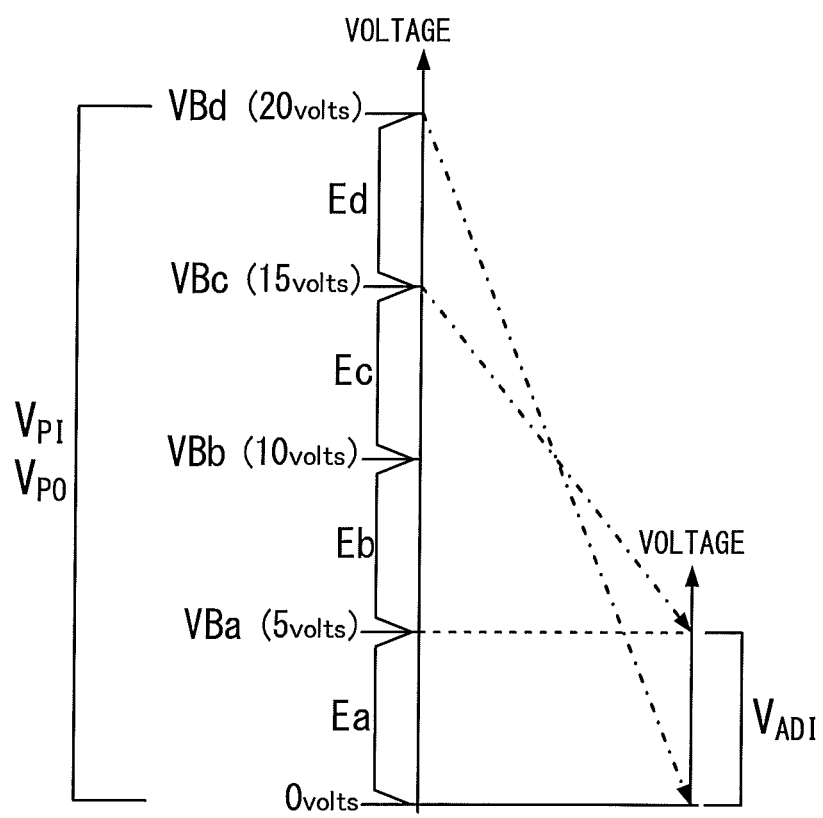
FIG. 6 is a diagram illustrating a mode for level-shifting of a voltage value preformed in the subtraction circuit 30 when a voltage value in the input signal $V_{PC}$ is in a range of the voltage region Ed.

In addition, in case that a voltage value of the input signal $V_{PO}$ is in the range of voltage region Ed (15 volts to 20 volts) shown in FIG. 2, the selector 21 supplies the reference voltage $V_{BSE}$ having the voltage value VBd (20 volts) to the subtraction circuit 30. Furthermore, the selector 22 supplies the shift datum DDd (01111) to the adder 23. Under this circumstance, the subtraction circuit 30 supplies, to the A/D converter 40, a level shift input signal $V_{ADI}$ having a voltage value which is obtained by subtracting the input signal $V_{PO}$ from the reference voltage $V_{BSE}$ having the voltage value VBd (20 volts). Further, the voltage value of the input signal $V_{PO}$ is in the range of voltage region Ed. Therefore, when the input signal $V_{PO}$ is subtracted from the voltage value VBd (20 volts), as shown in FIG. 6, the input signal $V_{PO}$ having the voltage value of voltage region Ed (15 volts to 20 volts) is converted into the level shift input signal $V_{ADI}$ which is level-shifted in the voltage range of voltage value VBa (5 volts) to 0 volts. In other words, under this circumstance, as shown in FIG. 5, the subtraction circuit 30 level-shifts the voltage value of voltage region Ed (15 volts to 20 volts) in the input signal $V_{PO}$ into the voltage range of voltage value VBa (5 volts) to 0 volts which is the input range of the A/D converter 40. Here, the level-shifted amount of the voltage value is the voltage value VBb. The A/D converter 40 supplies, to the adder 23, the digital datum DT of N bits, e.g., 5 bit which is a digital value obtained by converting the level shift input signal $V_{ADI}$ having the voltage range of voltage value VBa (5 volts) to 0 volts. Under this circumstance, the adder 23 outputs, as a final digital datum DAT, a result of addition obtained by adding the shift datum DDd (01111) to the digital datum DT. In other words, since the level-shifted amount of the voltage value is VBc (15 volts) in the subtraction circuit 30, the adder 23 adds, to the digital datum DT, the shift datum DDd (01111) denoting the voltage value VBc (15 volts) as a digital value in order to compensate for the level-shifted amount at this stage of digital datum.

Through these foregoing operations, the A/D conversion device 100 generates the digital data DAT of N bits denoting the voltage value of the input signal $V_{PI}$ (0 volts to 20 volts).

As described above, according to the A/D conversion device 100, when the input signal ($V_{PI}$, $V_{PO}$) is subjected to A/D conversion with the A/D converter 40, the subtraction circuit 30 provided to the front of the A/D converter 40 subtracts the input signal from the reference voltage $V_{BSE}$ so as to generate the level shift input signal $V_{ADI}$ which is level-shift from the voltage value of the input signal to supply it to the A/D converter 40. Therefore, even if the input voltage range is greater than the input range of the A/D converter 40, the subtraction circuit 30 enables to keep its voltage value within the input range of the A/D converter 40 without compressing the voltage value of the input signal.

Here, the reference voltages $V_{BSE}$ are set to the voltage values as described below. In other words, as shown in FIG. 3 to FIG. 6, the input voltage range $V_{PO}$ is divided into plural voltage regions Ea to Ed each having a width which is equal to or less than the input range Ea of the A/D converter 40, and then the reference voltage $V_{BSE}$ is set to the maximal voltage value in each of the plural voltage regions VBa to VBd including the instantaneous voltage value of the input voltage signal $V_{PO}$. By this, the level-shift operation is performed so that the voltage value of the input signal can be kept within the input range of the A/D converter 40 without being compressed.

Therefore, according to the A/D conversion device 100, when performing the A/D conversion with respect to the input signal having a voltage range greater than the input range of the A/D converter 40, there is prevented an A/D conversion accuracy from declining in comparison with a conventional device in which the voltage value of the input signal is compressed by the resistance voltage-dividing and then supplied to the A/D converter.

Further, although FIG. 1 illustrates a configuration in which the input signal $V_{PI}$ in a single route system is received as an object to be converted into a digital value, an A/D conversion device 100 may have another configuration receives plural input signals in a two or more route system as objects to be converted into digital values respectively, in which these plural input signals is sequentially subjected to the A/D conversion one by one, and selects one therefrom and supplies the selected input voltage signal to the A/D converter 40.

Figure 7:
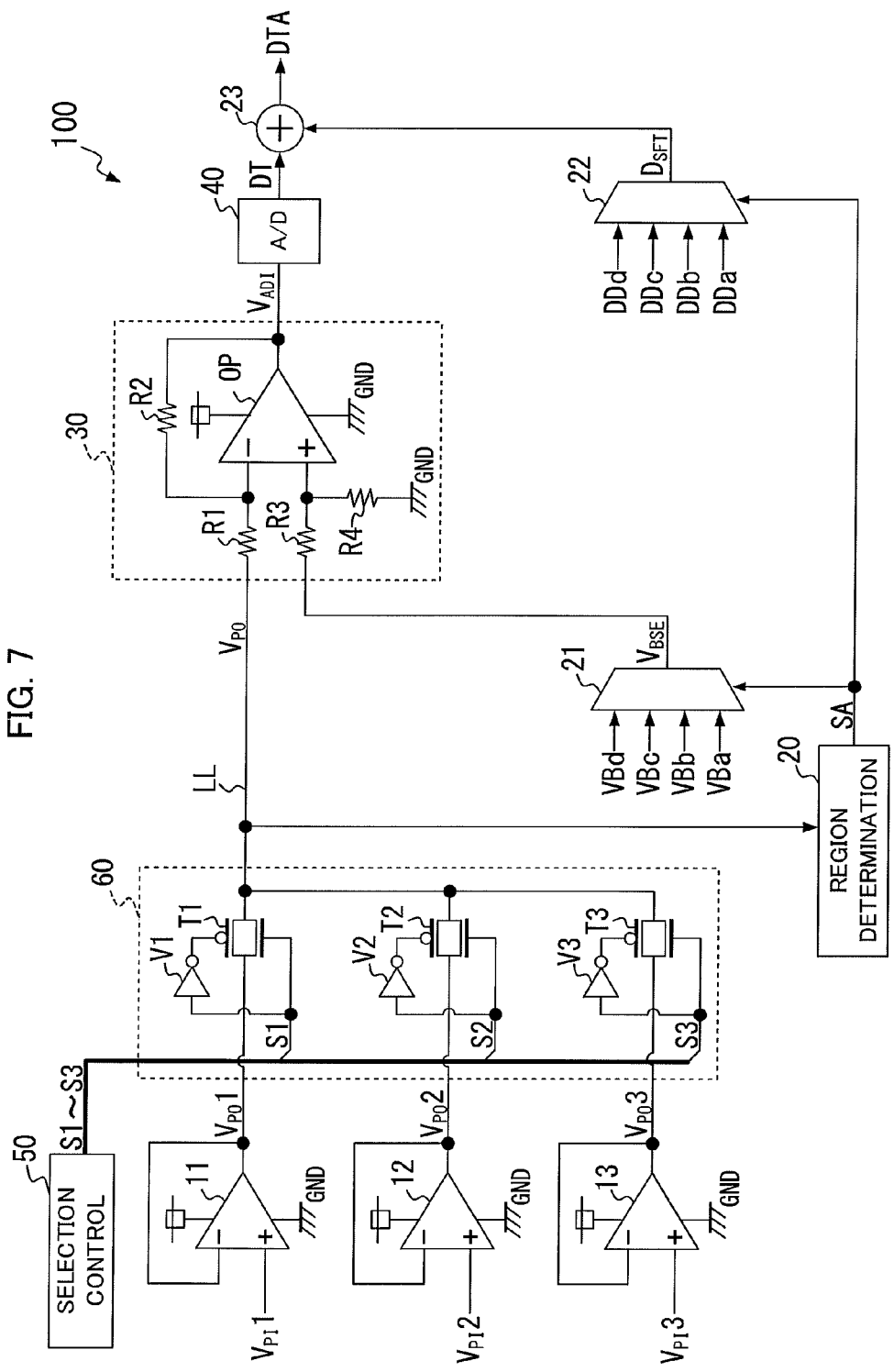
FIG. 7 is a circuit diagram illustrating a configuration of another A/D conversion device 100 as an example according to the present invention.

FIG. 7 is a circuit diagram illustrating a configuration of another A/D conversion device 100 made while taking such points into consideration. Further, the configuration shown in FIG. 7 and its operation are the same as ones shown in FIG. 1, except to employ operational amplifiers 11 to 13 in a three route system instead of the operational amplifier 10 in the single route system and further include a selection control part 50 and an input signal selector 60. Under this circumstance, the A/D conversion device 100 having the configuration shown in FIG. 7 receives input signals $V_{PI}1$, $V_{PI}2$ and $V_{PI}3$ of the three route system as objects to be converted into digital values respectively, and selects one from the input signals $V_{PI}1$, $V_{PI}2$ and $V_{PI}3$ to sequentially convert the selected one in to a digital value.

Each of operational amplifiers 11 to 13 in FIG. 7 is a so-called voltage-follower circuit in which its own output terminal and inversion input terminal are connected to each other.

The operational amplifier 11 amplifies a first input signal $V_{PI}1$ supplied via its non-inversion input terminal with a gain "1" to generate an input signal $V_{PO}1$ and supply it the input signal selector 60.

The operational amplifier 12 amplifies a second input signal $V_{PI}2$ supplied via its non-inversion input terminal with a gain "1" to generate an input signal $V_{PO}2$ and supply it to the input signal selector 60.

The operational amplifier 13 amplifies a third input signal $V_{PI}3$ supplied via its non-inversion input terminal with a gain "1" to generate an input signal $V_{PO}3$ and supply it to the input signal selector 60.

Figure 8:
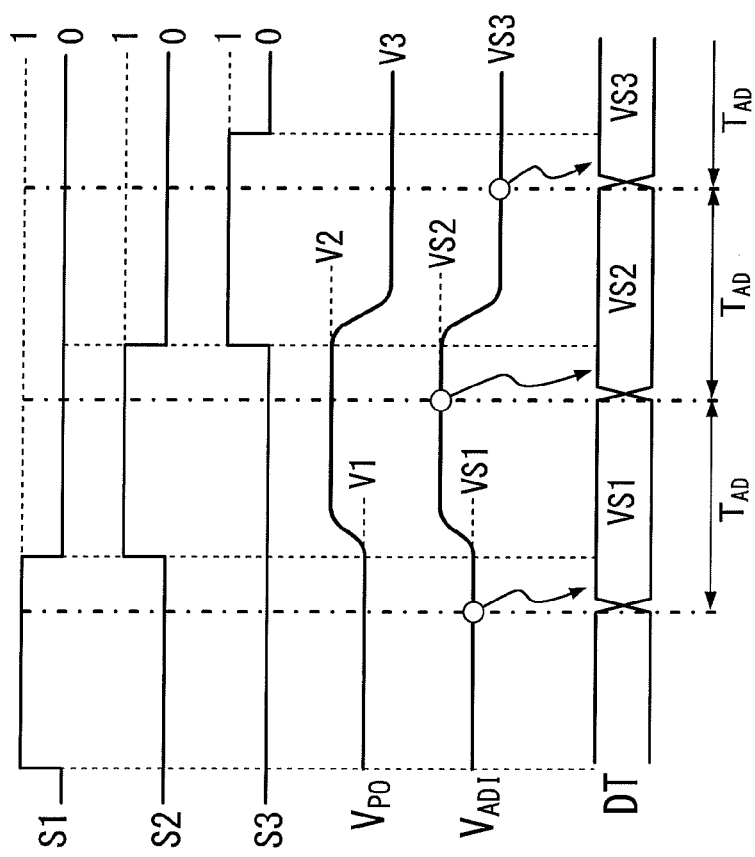
FIG. 8 is a timing diagram illustrating an internal operation of the A/D conversion device 100 shown in FIG. 7.

As shown in FIG. 8, the selection control part 50 supplies, to the input signal selector 60, a selection signal S1 having the logic level "1" denoting "selection" during a predetermined period and the logic level "0" denoting "non-selection" during a rest period other than the predetermined period. In addition, the selection control part 50 supplies, to the input signal selector 60, a selection signal S2 having the logic level "1" denoting "selection" during the predetermined period within a period that the selection signal S1 is in the logic level "0" and the logic level "0" denoting "non-selection" during a rest period other than the predetermined period. Furthermore, the selection control part 50 supplies, to the input signal selector 60, a selection signal S3 having the logic level "1" denoting "selection" during the predetermined period within a period that both the selection signals S1 and S2 are in the logic level "0" and the logic level "0" denoting "non-selection" during a rest period other than the predetermined period. Further, the predetermined period is the same period as a cycle of A/D conversion $T_{AD}$ which will be described below.

The input signal selector 60 comprises inverters V1 to V3 and transmission gates of CMOS (complementary metal-oxide semiconductor) type T1 to T3 (simply referred to as TG gates hereinafter).

The inverter V1 supplies a logic level inverted signal of the selection signal S1 to the p-channel side gate terminal of the transmission gate T1. The n-channel side gate terminal of the TG gate T1 receives the supplied selection signal S1. The signal input terminal of the TG gate T1 is connected to the output terminal of the operational amplifier 11. The signal output terminal of the TG gate T1 is connected to the output line LL. The TG gate T1 has an ON state and supplies the input signal $V_{PO}1$ to the output line LL, only when the selection signal S1 is in the logic level "1".

The inverter V2 supplies a logic level inverted signal of the selection signal S2 to the p-channel side gate terminal of the TG gate T2. The n-channel side gate terminal of the TG gate T2 receives the supplied selection signal S2. The signal input terminal of the TG gate T2 is connected to the output terminal of the operational amplifier 12. The signal output terminal of the TG gate T2 is connected to the output line LL. The TG gate T2 has an ON state and supplies the input signal $V_{PO}2$ to the output line LL, only when the selection signal S2 is in the logic level "1".

The inverter V3 supplies a logic level inverted signal of the selection signal S3 to the p-channel side gate terminal of the TG gate T3. The n-channel side gate terminal of the TG gate T3 receives the supplied selection signal S3. The signal input terminal of the TG gate T3 is connected to the output terminal of the operational amplifier 13. The signal output terminal of the TG gate T3 is connected to the output line LL. The TG gate T3 has an ON state and supplies the input signal $V_{PO}3$ to the output line LL, only when the selection signal S3 is in the logic level "1".

According to the foregoing configuration, the input signal selector 60 selects one input signal from the input signals $V_{PO}1$ to $V_{PO}3$ of the three route system on the basis of the selection signals S1 to S3 and applies the selected input signal to the output line LL. Under this circumstance, the voltage applied to the output line LL is supplied to the region determination part 20 and the subtraction circuit 30 as the input signal $V_{PO}$.

In other words, as shown in FIG. 8, the input signal selector 60 selects the input signal $V_{PO}1$ in response to the selection signal S1 of the logic level "1" and the selection signals S2 and S3 of the logic level "0", and supplies, to the subtraction circuit 30, the input signal $V_{PO}$ having the voltage value V1 denoted by the input signal $V_{PO}1$. Next, the input signal selector 60 selects the input signal $V_{PO}2$ in response to the selection signals S1 and S3 of the logic level "0" and the selection signal S2 of the logic level "1", and supplies, to the subtraction circuit 30, the input signal $V_{PO}$ having the voltage value V2 denoted by the input signal $V_{PO}2$. Next, the input signal selector 60 selects the input signal $V_{PO}3$ in response to the selection signals S1 and S2 of the logic level "0" and the selection signal S3 of the logic level "1", and supplies, to the subtraction circuit 30, the input signal $V_{PO}$ having the voltage value V3 denoted by the input signal $V_{PO}3$.

By this, as shown in FIG. 8, the subtraction circuit 30 level-shifts the respective voltage values (instantaneous voltage values) of the input signal $V_{PO}$ changing into the voltage values V1, V2 and V3 with lapse of time to generate the level shift input signal $V_{ADI}$ changing into the voltage value VS1, VS2 and VS3 and supply it to the A/D converter 40. The A/D converter 40 starts the A/D conversion processing at a timing shown by the dashed line in FIG. 8 and converts the voltage value of the level shift input signal $V_{ADI}$ into the digital value. In other words, the A/D converter 40 preforms the A/D conversion with respect to the level shift input signal $V_{ADI}$ every cycle of A/D conversion $T_{AD}$ shown in FIG. 8. By this, the A/D converter 40 sequentially converts the voltage value VS1, VS2 and VS3 shown in FIG. 8 into the digital values and outputs them as the digital data DT respectively.

Therefore, according to the configuration shown in FIG. 7, the usage of the single A/D converter 40 enables to receive two or more input signals as objects to be converted into digital values respectively. Therefore, this configuration enables to reduce the circuit scale of a device in comparison with a configuration having the A/D converters provided for input signal respectively.

Figure 9:
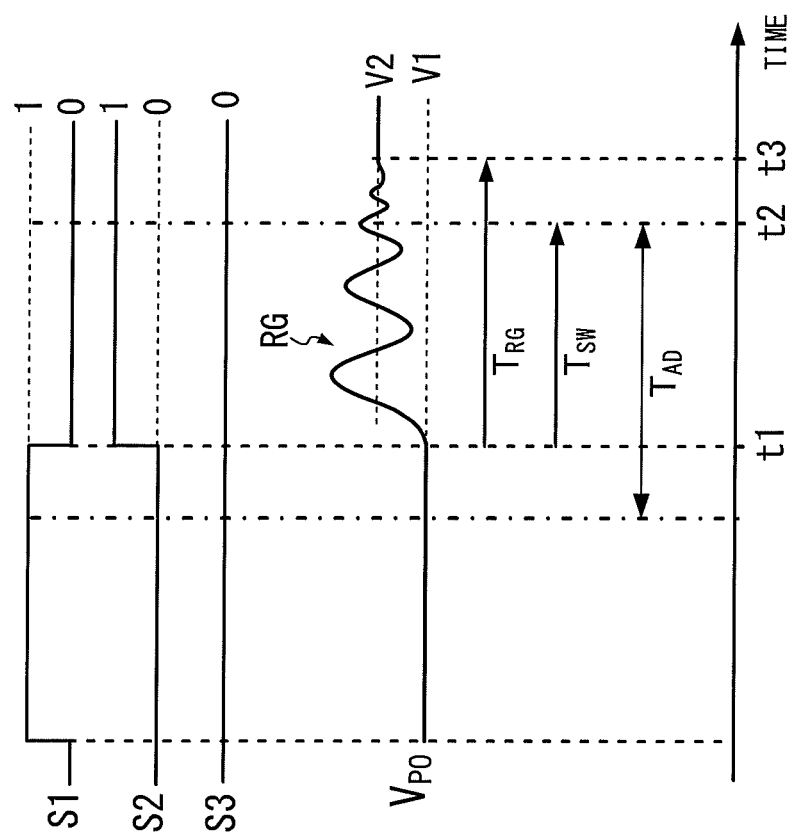
FIG. 9 is a wave form chart of input signal $V_{PO}$ with a timing diagram illustrating an example of ringing occurring in switching of the input signal.

Here, when the switching of the input signal is performed by the input signal selector 60 above mentioned, for example, from the time point t1 shown in FIG. 9, there occurs a voltage fluctuation of the input signal $V_{PO}$, i.e., ringing. Under this circumstance, as shown in FIG. 9, if a convergence period of ringing $T_{RG}$ (from the time point t1 of the input signal in the input signal selector 60 until the ringing RG id converged) is greater than a standby period of stabilization $T_{SW}$ (from the time point t1 to the time point t2 the next A/D conversion processing is started), i.e., convergence of the ringing RG is not completed yet, then the A/D conversion results in occurrence of an error.

Figure 10:
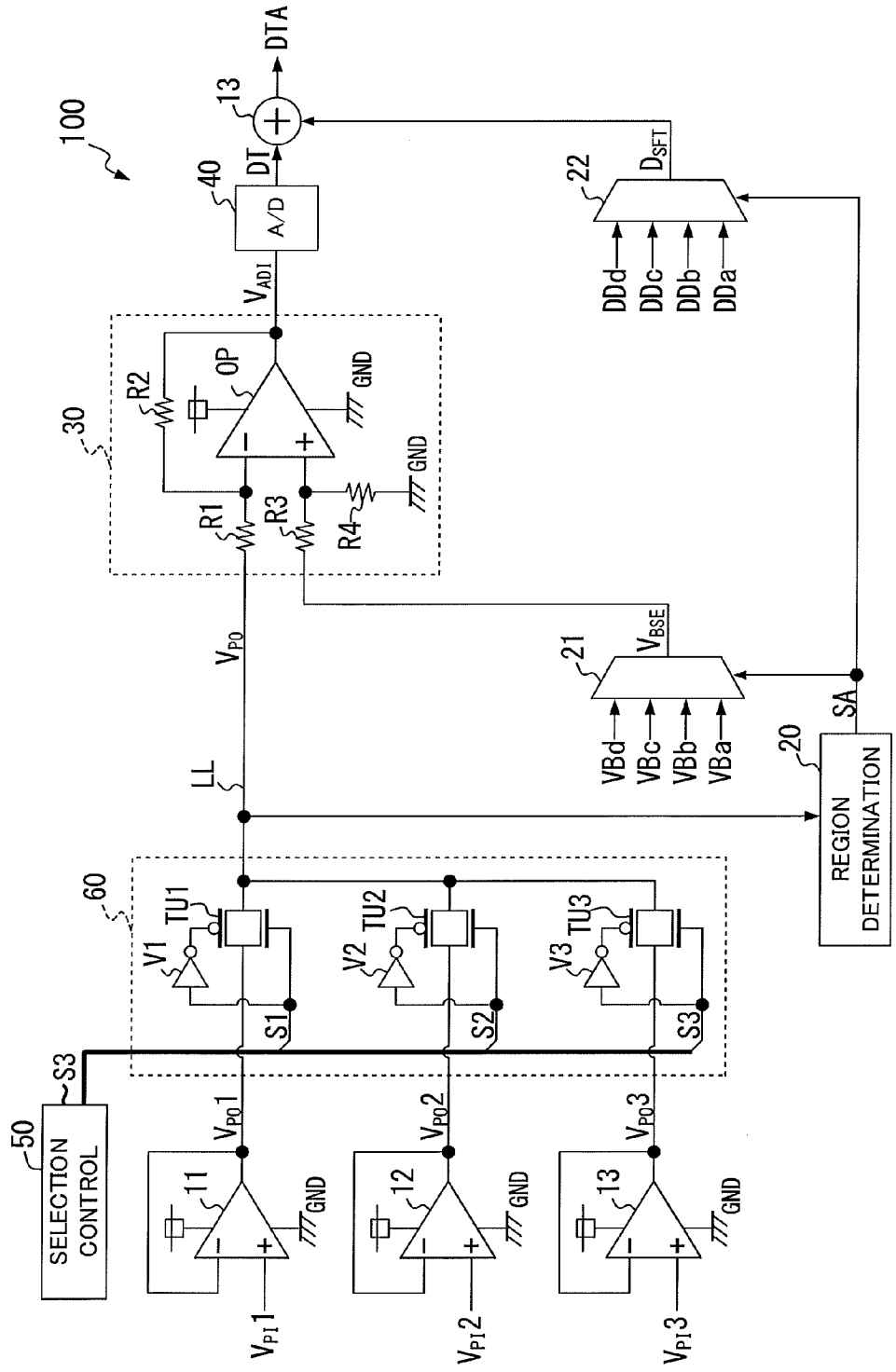
FIG. 10 is a circuit diagram illustrating a modification of the A/D conversion device 100 shown in FIG. 7.

FIG. 10 is a circuit diagram illustrating a modification of the A/D conversion device 100 shown in FIG. 7 made in order to restrain such an error of A/D conversion caused by the ringing RG.

Further, the configuration shown in FIG. 10 is the same as one shown in FIG. 7 except to employ TG gates TU1 to TU3 instead of the TG gates T1 to T3.

The operation of each of the TG gates TU1 to TU3 in FIG. 10 is the same as one of the TG gates T1 to T3, except that each gate length of the TG gates TU1 to TU3, i.e., each of gate lengths of p-channel side and n-channel side of the MOS transistor consisting the TG gate, is longer than each gate length of the TG gates T1 to T3. In other words, the longer the gate length of the TG gate becomes, the higher the ON resistance of the TG gate per se increases and the shorter the convergence period of ringing $T_{RG}$ becomes.

Thus, the gate length of the TG gates TU1 to TU3 shown in FIG. 10 is set such that the convergence period of ringing $T_{RG}$ is shorter than the standby period of stabilization $T_{SW}$.

Therefore, according to the configuration shown in FIG. 10, it is possible to restrain the error of A/D conversion caused by the ringing RG generated in the switching of the input signal performed by the input signal selector 60.

Further, the configuration to restrain the error of A/D conversion caused by the ringing is not limited only the configuration shown in FIG. 10.

Figure 11:
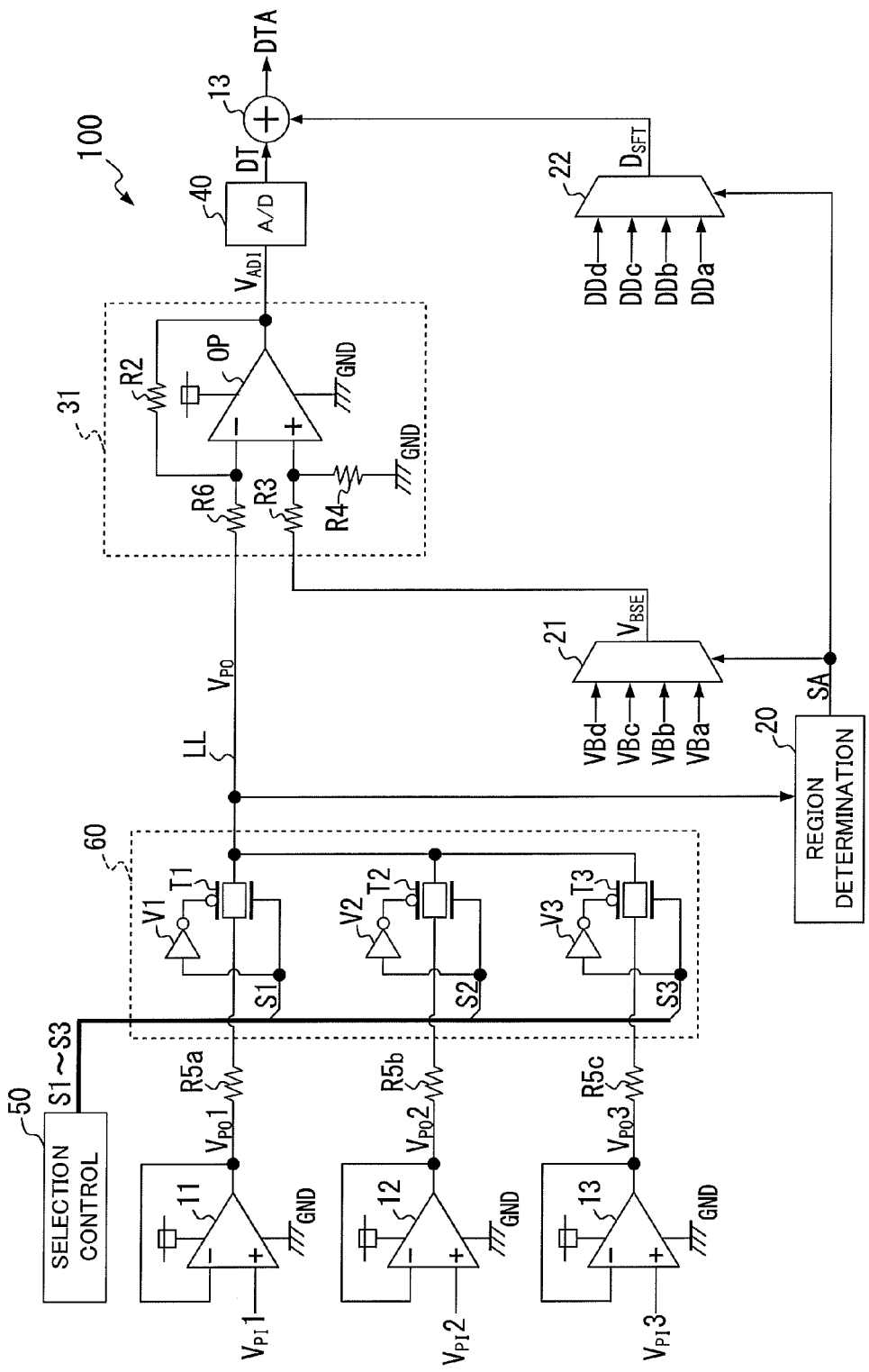
FIG. 11 is a circuit diagram illustrating another modification of the A/D conversion device 100 shown in FIG. 7.

FIG. 11 is a circuit diagram illustrating another modification of the A/D conversion device 100 shown in FIG. 7 made while taking such points into consideration. Further, the configuration shown in FIG. 11 is the same as one shown in FIG. 7 except to employ resistors R5a to R5c provided between the input signal selector 60 and the respective operational amplifiers 11 to 13 respectively and employ a subtraction circuit 31 instead of the subtraction circuit 30.

In other words, in the configuration shown in FIG. 11, the input signal $V_{PO}1$ output from the operational amplifier 11 is supplied via the resistor R5a to the TG gate T1 of the input signal selector 60. The input signal $V_{PO}2$ output from the operational amplifier 12 is supplied via the resistor R5b to the TG gate T2 of the input signal selector 60. The input signal $V_{PO}3$ output from the operational amplifier 13 is supplied via the resistor R5c to the TG gate T3 of the input signal selector 60.

In addition, the subtraction circuit 31 shown in FIG. 11 has the same configuration as the subtraction circuit 30 shown in FIG. 7 except to employ a resistor R6 instead of the resistor R1 shown in FIG. 7. Further, the resistors R5a to R5c have the same resistance value. The resistance value of the resistor R6 is set to a resistance value with is obtained by subtracting the resistance value of the resistor R1 shown in FIG. 7 from the resistance value of the resistor R5a. In other words, the configuration shown in FIG. 11 is the same as one shown in FIG. 7 with respect to the resistance value of the whole current path extending from the output terminal of each of the operational amplifiers 11 to 13 to the inversion input terminal of the operational amplifier OP, except to employ resistors R5a to R5c inserted between the respective operational amplifiers 11 to 13 and the input signal selector 60 respectively.

According to the configuration shown in FIG. 11, the resistors R5a to 5c (provided in the current path between each of the output terminals of the operational amplifiers 11 to 13 and the input signal selector 60) make the resistance value of each current path higher in comparison with the configuration shown in FIG. 7, so that the generation of the ringing is restrained. Furthermore, according to the configuration shown in FIG. 11, the area to be layout for the device can be decreased, although the resistors R5a to 5c are added thereto, in comparison with the configuration shown in FIG. 10 in which each of the TG gates TU1 to TU3 has the gate length longer than that of the TG gates T1 to T3.

Further, FIG. 7, FIG. 10 and FIG. 11 illustrate exemplary configurations in each of which the input signals ($V_{PI}1$ to $V_{PI}3$) in three route system are subjected to the time division and the A/D conversion. However, the number of the input signals received as objects to be converted into digital values respectively is not limited to the three systems for the A/D conversion objects. In conclusion, it is preferable to use a selector which sequentially alternatively selects the first to the n-th input voltage signals ("n" is an integer of 2 or more), and supplies the selected input voltage signal to the A/D converter.

In addition, the example shown in FIG. 10 is configured to increase the ON resistance of the TG gate by increasing the gate length of the TG gate so as to shorten the convergence period of ringing $T_{RG}$ in the switching of the input signal performed by the input signal selector 60. Furthermore, as far as the ON resistance is increased, it is possible to employ a configuration of each of the TG gate having a narrower gate width or a configuration such that the TG gate has a so call non-salicide structure which is manufactured without using a SALICIDE (Self-Aligned siLICIDE) technology.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims.

This application is based upon and claims the benefit of priority from the prior Japanese Patent Application No. 2015-031916 filed on Feb. 20, 2015, the entire contents of which are incorporated herein by reference.

What is claimed is:

1. An A/D conversion device comprising:
   a level shifter circuit configured to level-shift an analog voltage of an input voltage signal to generate a conversion signal;
   an A/D converter configured to A/D-convert a voltage of said conversion signal supplied from said level shifter circuit into a digital value, wherein said level shifter circuit subtracts an instantaneous voltage value of said input voltage signal from a reference voltage so as to output a signal value as said conversion signal; and
   a reference voltage setting part configured so as to divide a voltage range in which a voltage value of the input voltage range varies into plural voltage regions each having a width which is equal to or less than an input range of said A/D converter, and to select, from said plural voltage regions, an instantaneous voltage region including said instantaneous voltage value of said input voltage signal, and to set, as said reference voltage, a maximal voltage value in said instantaneous voltage region selected.

2. The A/D conversion device according to claim 1, wherein said reference voltage setting part comprising:
   a region determination part configured to determines which of said plural voltage regions said instantaneous voltage value of said input voltage signal belongs to; and
   a selector configured to select, from respective maximal voltage values of said plural voltage regions, a voltage value corresponding to an instantaneous voltage region determined by said region determination part, and supplies the selected voltage value as said reference voltage to said level shifter circuit.

3. The A/D conversion device according to claim 2 further comprising a shift data selector configured to select, from the respective minimal voltage values of said plural voltage regions, a voltage value corresponding to said instantaneous voltage region determined by said region determination part, and to output the selected voltage value as a shift datum.

4. The A/D conversion device according to claim 3 further comprising an adder configured to add said shift datum to said digital value supplied from said A/D converter to generate a digital datum.

5. An A/D conversion device comprising:
   an input signal selector configured to sequentially alternatively select the first to the n-th input voltage signals ("n" is an integer of 2 or more), and output the selected input voltage signal via an output line;
   a subtraction circuit configured to subtract, from a reference voltage, the voltage value of said input voltage signal output from said selector so as to generate a conversion signal having a reduced voltage value; and
   an A/D converter configured to A/D-convert a voltage value of said conversion signal into a digital value.

6. The A/D conversion device according to claim 5 further comprising a reference voltage setting part configured so as to divide a voltage range in which a voltage value of the input voltage range varies into plural voltage regions each having a width which is equal to or less than an input range of said A/D converter, and to select, from said plural voltage regions, an instantaneous voltage region including said instantaneous voltage value of said input voltage signal, and to set, as said reference voltage, a maximal voltage value in said instantaneous voltage region selected.

7. The A/D conversion device according to claim 6, wherein said reference voltage setting part comprising:
   a region determination part configured to determines which of said plural voltage regions said instantaneous voltage value of said input voltage signal belongs to; and
   a reference voltage selector configured to select, from respective maximal voltage values of said plural voltage regions, a voltage value corresponding to an instantaneous voltage region determined by said region determination part, and supplies the selected voltage value as said reference voltage to said level shifter circuit.

8. The A/D conversion device according to claim 7 further comprising a shift data selector configured to select, from the respective minimal voltage values of said plural voltage regions, a voltage value corresponding to said voltage region determined by said region determination part, and to output the selected voltage value as a shift datum.

9. The A/D conversion device according to claim 8 further comprising an adder configured to add said shift datum to said digital value supplied from said A/D converter to generate a digital datum.

10. The A/D conversion device according to claim 5, wherein said A/D converter converts the voltage value of said conversion signal to the digital value at an A/D conversion timing of a cycle being a same as a switching cycle of said first to the n-th input voltage signals performed by said input signal selector.

11. The A/D conversion device according to claim 10, wherein
   said input signal selector has a transmission gate of MOS (metal-oxide semiconductor) type which alternatively applies said first to the n-th input voltage signals to said output line,
   the gate length of said transmission gate is set such that a convergence period of a ringing generated at a switching time point is shorter than a period from a switching time point in said first to the n-th input voltage signals in said input signal selector to said A/D conversion timing.

12. The A/D conversion device according to claim 5, wherein said first to the n-th input voltage signals are supplied to said input signal selector via the first to the n-th resistors respectively.

\* \* \* \* \*